(12) United States Patent
Zhou et al.

(10) Patent No.: US 9,755,043 B2
(45) Date of Patent: Sep. 5, 2017

(54) TRENCH GATE POWER SEMICONDUCTOR FIELD EFFECT TRANSISTOR

(71) Applicant: Shuk-Wa Fung, Hong Kong (CN)

(72) Inventors: Xianda Zhou, Hong Kong (CN); Shuk-Wa Fung, Hong Kong (CN); Johnny Kin On Sin, Hong Kong (CN)

(73) Assignee: Shuk-Wa Fung, Hong Kong (CN)

( * ) Notice: Subject to any disclaimer, the term of this patent is extended or adjusted under 35 U.S.C. 154(b) by 0 days.

(21) Appl. No.: 14/771,089

(22) PCT Filed: Dec. 4, 2014

(86) PCT No.: PCT/CN2014/092997
§ 371 (c)(1),
(2) Date: Aug. 27, 2015

(87) PCT Pub. No.: WO2016/086381
PCT Pub. Date: Jun. 9, 2016

(65) Prior Publication Data
US 2016/0372572 A1 Dec. 22, 2016

(51) Int. Cl.
*H01L 29/739* (2006.01)
*H01L 29/78* (2006.01)
(Continued)

(52) U.S. Cl.
CPC ...... *H01L 29/66348* (2013.01); *H01L 21/265* (2013.01); *H01L 21/28556* (2013.01); *H01L 21/3065* (2013.01); *H01L 21/324* (2013.01); *H01L 29/0649* (2013.01); *H01L 29/0804* (2013.01); *H01L 29/0821* (2013.01); *H01L 29/0856* (2013.01); *H01L 29/1095* (2013.01); *H01L 29/41766* (2013.01); *H01L 29/6634* (2013.01); *H01L 29/66295* (2013.01); *H01L 29/66333* (2013.01); *H01L 29/66727* (2013.01);
(Continued)

(58) Field of Classification Search
CPC ......... H01L 29/66333; H01L 29/66295; H01L 29/7397; H01L 29/7813; H01L 29/66348
See application file for complete search history.

(56) References Cited

U.S. PATENT DOCUMENTS

| | | | | |
|---|---|---|---|---|
| 5,770,514 A * | 6/1998 | Matsuda | ............. | H01L 29/7813 257/E29.128 |
| 6,037,628 A * | 3/2000 | Huang | ............. | H01L 29/41716 257/329 |
| 6,214,673 B1 * | 4/2001 | Grebs | ................ | H01L 29/6634 257/344 |
| 6,573,559 B2 * | 6/2003 | Kitada | ............... | H01L 29/0634 257/329 |
| 6,706,615 B2 * | 3/2004 | Kitada | ............... | H01L 29/0634 257/E29.003 |
| 7,138,668 B2 * | 11/2006 | Hayashi | ............... | H01L 21/046 257/183 |
| 8,319,278 B1 * | 11/2012 | Zeng | ................... | H01L 29/7813 257/330 |
| 9,455,248 B2 * | 9/2016 | Hebert | ............... | H01L 27/0629 |

(Continued)

FOREIGN PATENT DOCUMENTS

| | | |
|---|---|---|
| CN | 101385148 | 3/2009 |
| CN | 103730500 | 4/2014 |

OTHER PUBLICATIONS

International Search Report for PCT/CN2014/092997, dated Jul. 28, 2015, 4 pages including English translation.

*Primary Examiner* — Evan Pert
(74) *Attorney, Agent, or Firm* — Hamre, Schumann, Mueller & Larson, P.C.

(57) ABSTRACT

Provided in the present invention is a trench gate power MOSFET (TMOS/UMOS) structure with a heavily doped polysilicon source region. The polysilicon source region is formed by deposition, and a trench-shaped contact hole is used at the source region, in order to attain low contact resistance and small cell pitch. The present invention may also be implemented in an IGBT.

48 Claims, 17 Drawing Sheets

(51) Int. Cl.

| | | |
|---|---|---|
| *H01L 29/66* | (2006.01) | |
| *H01L 29/08* | (2006.01) | |
| *H01L 21/265* | (2006.01) | |
| *H01L 21/285* | (2006.01) | |
| *H01L 21/3065* | (2006.01) | |
| *H01L 21/324* | (2006.01) | |
| *H01L 29/06* | (2006.01) | |
| *H01L 29/10* | (2006.01) | |
| *H01L 29/417* | (2006.01) | |

(52) U.S. Cl.
CPC .... *H01L 29/66734* (2013.01); *H01L 29/7397* (2013.01); *H01L 29/78* (2013.01); *H01L 29/7813* (2013.01)

(56) References Cited

U.S. PATENT DOCUMENTS

| | | | |
|---|---|---|---|
| 2002/0088989 A1* | 7/2002 | Kim | H01L 29/7391 |
| | | | 257/135 |
| 2003/0020134 A1* | 1/2003 | Werner | H01L 27/0705 |
| | | | 257/471 |
| 2003/0075759 A1 | 4/2003 | Kawano et al. | |
| 2004/0041207 A1* | 3/2004 | Takano | H01L 29/7813 |
| | | | 257/330 |
| 2010/0163975 A1 | 7/2010 | Hshieh | |
| 2011/0248340 A1 | 10/2011 | Hsieh | |

\* cited by examiner

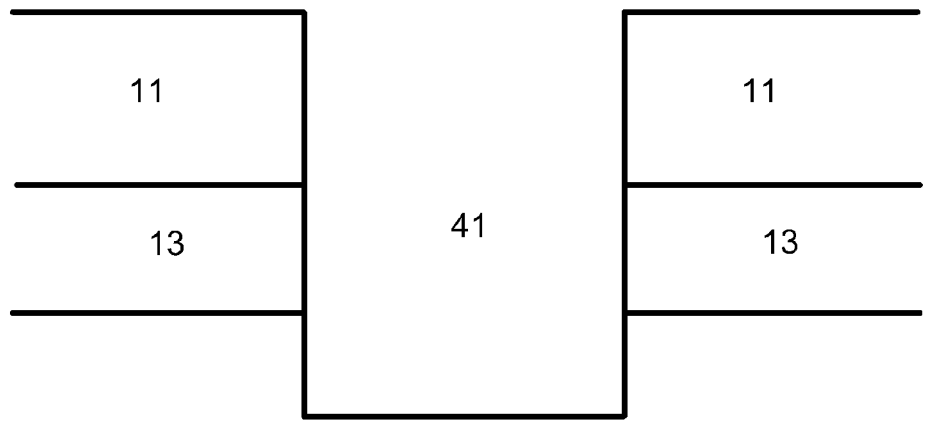

TRENCH GATE POWER SEMICONDUCTOR FIELD EFFECT TRANSISTOR

BACKGROUND

Technical Field

The present invention generally relates to a structure and manufacturing of power field effect transistors, and specifically relates to a trench gate power metal oxide semiconductor field effect transistor (MOSFET) and a trench gate insulated gate bipolar transistor (IGBT).

Related Art

The present invention will be described in an n channel power FET, but it will be appreciated in the following description that the present invention is also applicable to a p channel power FET. In the specification of the present invention, heavily doped n-type regions are labeled as n+ and heavily doped p-type regions are labeled as p+. These heavily doped regions usually have a doping concentration of between $1\times10^{18}$ cm$^{-3}$ and $1\times10^{21}$ cm$^{-3}$. On the other hand, lightly doped n-type regions are labeled as n- and lightly doped p-type regions are labeled as p-. These lightly doped regions usually have a doping concentration of between $1\times10^{13}$ cm$^{-3}$ and $1\times10^{17}$ cm$^{-3}$.

Low-voltage power MOSFETs have been widely used in switch mode power supplies (e.g. DC-DC converters). For example, a central processing unit (CPU) in the current advanced technology needs a DC-DC converter, which provides high output current of about 10 A and low output voltage simultaneously. In order to obtain high efficiency in the converter, the power MOSFET here should have extremely low on-resistance. The important component part of the on-resistance of the low-voltage power MOSFET is the channel resistance. Therefore, a trench gate structure is usually used in the low-voltage power MOSFET to provide a larger channel density than that of a planar structure. In addition, the cell pitch of the trench gate power MOSFET needs to be reduced to increase the channel density. Therefore, the object of the present invention is to provide a low-voltage trench gate power MOSFET with a small cell pitch and therefore a low on-resistance. Also, the small cell pitch is also desirable in a trench gate IGBT structure, because the small cell pitch can achieve injection enhancement near an emitter and thus decrease the on-state voltage drop. Therefore, another object of the present invention is to provide a trench gate IGBT with low on-state voltage drop.

In addition to the on-resistance demand, the trench gate power MOSFET (TMOS) also needs to have high reliability. For example, due to the activation of the parasitic BJT in this device, the device should not fail during the unclamped inductive switching (UIS). Therefore, yet another object of the present invention is to provide a TMOS with improved UIS strength. In addition, the activation of the parasitic BJT in the IGBT should also be prevented to realize latch-up free of the device. Therefore, yet another object of the present invention is to provide a latch-up free trench gate IGBT.

The cross section of a TMOS structure in the prior art is shown in FIG. 1. The channels of the device are positioned on the side wall surface of a p-type body region (13), and an n+ source region (11) and an n-epi (14) are connected through the channels in the on-state. The on-resistance of the device is mostly dependent on the cell pitch of the device. A small cell pitch is required to realize a high channel density and therefore a low channel resistance.

The cross section [1] of a trench gate TMOS structure in the prior art is shown in FIG. 2. As shown in the figure, an interlayer dielectric (ILD) (32) is positioned on the top of a gate electrode (21) in a trench, and the gate electrode (21) is isolated from a source electrode (22) by the ILD (32). As compared with the structure shown in FIG. 1, the width of the n+ source region (11) can be reduced, because there is no lateral space between the source contact holes and the gate electrode (21) in the trench gate TMOS. The reduced cell pitch can result in a reduced on-resistance compared with the structure shown in FIG. 1. However, a complicated deposition and deep etching process is required to form the ILD (32) in the device.

In the device structures shown in FIG. 1 and FIG. 2, an advanced photolithography technology can be used to reduce the cell pitch without changing the structures. However, the reduced cell pitch in those structures can also result in the reduced contact area of the n+ source region (11) and the source electrode (22), and the contact resistance here will increase. Due to such restriction, even if the advanced photolithography technology is used, the on-resistance of those devices still cannot be reduced a lot. In order to mitigate contact problems, a buried gate TMOS structure has been proposed, as shown in FIG. 3. However, in the buried gate structure, the contact area is still restricted by the cell pitch, and contact problems cannot be solved completely.

In order to solve the contact problem at the source, a trench-shaped source contact hole TMOS structure [3] is proposed. The cross section of the trench-shaped source contact hole TMOS structure is shown in FIG. 4. In this structure, the n- source region (11) contacts the source electrode (22) at the side wall of the trench-shaped contact hole. The contact area at the source is not restricted by the cell pitch, and the contact area is only determined by the depth of the n- source region (11), instead of the width of the n+ source region (11). This structure enables the device to be manufactured with the advanced photolithography technology, and the contact resistance at the source will not be increased. However, the structure needs a deep n+ source region (11) to provide a big source contact area, but a shallow n+ source region (11) is generally used in the structure to obtain an approximately uniform doping profile in the p-type body region (13). As shown in the figure, the p-type body region (13) is positioned below the n+ source region (11), and for reducing the channel resistance, the uniformly doped p-type body region (13) is desirable [4]. Both the p-type body region (13) and the n+ source region (11) are usually formed by ion implantation and annealing. In the case of the shallow n- source region (11), the approximately uniform doping profile in the p-type body region (13) can be obtained through multiple times of low-energy ion implantation, because the standard deviation of these implanted projected ranges is relatively small. However, if the n+ source region (11) is relatively deep, high-energy ion implantation is required to form the p-type body region (13), and it is difficult to realize approximately uniform doping profile due to the relatively large standard deviation of the implanted projected range. Due to the shallow n+ source region (11) used in the structure, compared with these structures previously shown in FIG. 1, FIG. 2 and FIG. 3, the contact resistance at the source cannot be reduced a lot.

SUMMARY

Therefore, the object of the present invention is to provide a trench gate power MOSFET (TMOS) structure with reduced on-resistance.

To realize this and other objects, provided in the present invention is a TMOS structure with a heavily doped polysilicon source region. FIG. 5 shows the cross section of the device structure. As shown in the figure, the polysilicon n+ source region (11) has a depth (thickness) much larger than that of a conventional TMOS, and can provide a relatively lower contact resistance on the side wall of the n+ source region (11) compared with the conventional TMOS The polysilicon n+ source region (11) can be formed by low-temperature deposition after the p-type body region (13) is formed. Therefore, the doping profile of the p-type body region (13) can be well controlled, since it is formed near the surface of silicon. On the other hand, compared with the cell pitch of the device shown in FIG. 1, the trench-shaped contact hole at the source of the device provides a reduced cell pitch. Through the use of the trench-shaped contact hole, the polysilicon n− source region (11) is contacted by the source electrode (22) on the side wall of the contact hole, and if the cell pitch is further decreased by using more advanced photolithography, the contact resistance will not increase. In addition, the trench-shaped contact hole also provides a low base resistance of the parasitic n+ source region (11)/P-type body region (13)/n−-epi (14) bipolar junction transistor (BJT), thereby giving the device a more rugged UIS performance [5].

In addition, the present invention may also be implemented in a trench gate IGBT structure to provide reduced on-state drop and latch-up free feature.

A trench gate power MOSFET structure comprises:

a drain electrode (23) at the bottom, a heavily doped substrate (15) of a first conductivity type, the heavily doped substrate (15) being located on the top of the drain electrode (23), a lightly doped epitaxial layer (14) of the first conductivity type, the lightly doped epitaxial layer (14) being located on the top of the heavily doped substrate (15), a body region (13) of a second conductivity type, the body region (13) being located on the top of the epitaxial layer (14), a heavily doped diffusion region (12) of the second conductivity type, the heavily doped diffusion region (12) connecting the body region (13) to a source electrode (22), the source electrode (22), the source electrode (22) being located in a trench-shaped contact hole (42) and also on the top of a device, a heavily doped polysilicon source region (11) of the first conductivity type, the heavily doped polysilicon source region (11) being located on the top of the body region (13) and contacted by the source electrode (22) on the side wall of the trench-shaped contact hole (42), a gate dielectric (31), the gate dielectric (31) covering the surface of the side wall of the body region (13) and forming a channel between the source region (11) and the epitaxial layer (14), a gate electrode (21), the gate electrode (21) being close to the gate dielectric (31) in a gate trench (41), and an interlayer dielectric (32), the interlayer dielectric (32) covering the upper surface of the gate electrode (21) and the upper surface of the source region (11).

Further, the gate dielectric (31) is silicon oxide or a dielectric with a high dielectric constant, including, but not limited to, hafnium dioxide and aluminum oxide.

Further, the gate electrode (21) is at least one of polysilicon, metal and metal silicide.

Further, the ILD (32) is silicon oxide.

Further, the body region (13) has an approximately uniform doping profile.

Further, the source (24) and the drain (25) are metals or metal silicides, including, but not limited to, aluminum, copper, tungsten, titanium silicides, cobalt silicides and nickel silicides.

A trench gate IGBT structure comprises:

a collector electrode (25) collector electrode (25) at the bottom, a heavily doped collector region (17) of a second conductivity type, the heavily doped collector region (17) being located on the top of the collector electrode (25) collector electrode (25), a buffer region (16) of a first conductivity type, the buffer region (16) being located on the top of the collector region (17), a lightly doped drift region (14) of the first conductivity type, the lightly doped drift region (14) being located on the top of the buffer region (16), a body region (13) of the second conductivity type, the body region (13) being located on the top of the drift region (14), a heavily doped diffusion region (12) of the second conductivity type, the heavily doped diffusion region (12) connecting the body region (13) to an emitter electrode (24), the emitter electrode (24), the emitter electrode (24) being located in a trench-shaped contact hole (42) and also on the top of a device, a heavily doped polysilicon emitter region (11) of the first conductivity type, the heavily doped polysilicon emitter region (11) being located on the top of the body region (13) and contacted by the emitter electrode (24) on the side wall of the trench-shaped contact hole (42), a gate dielectric (31), the gate dielectric (31) covering the surface of the side wall of the body region (13) and forming a channel between the emitter region (11) and the drift region (14), a gate electrode (21), the gate electrode (21) being close to the gate dielectric (31) in a gate trench (41), and an interlayer dielectric (32), the interlayer dielectric (32) covering the upper surface of the gate electrode (21) and the upper surface of the emitter region (11).

Further, the emitter electrode (24) and the collector electrode (25) collector electrode (25) are metals or metal silicides, including, but not limited to, aluminum, copper, tungsten, titanium silicides, cobalt silicides and nickel silicides.

Further, the gate dielectric (31) is silicon oxide or a dielectric with a high dielectric constant, including, but not limited to, hafnium dioxide and aluminum oxide.

Further, the gate electrode (21) is at least one of polysilicon, metal and metal silicide.

Further, the ILD (32) is silicon oxide.

Further, the body region (13) has an approximately uniform doping profile.

A method for manufacturing the trench gate power MOSFET structure comprises:

starting with an epitaxial wafer, wherein the lightly doped epitaxial layer (14) of the first conductivity type is located on the top of the heavily doped substrate (15) of the first conductivity type, forming the body region (13) of the second conductivity type on the top of the epitaxial layer (14);

forming the heavily doped polysilicon source region (11) of the first conductivity type on the top of the body region (13), forming the gate trench (41) by patterning the polysilicon source region (11) and the body region (13), forming the gate dielectric (31) in the gate trench (41) and on the upper surface of the polysilicon source region (11), forming the gate electrode (21) by deposition and deep etching;

depositing the ILD (32) on the top of the gate electrode (21) and on the surface of the source region (11);

forming the trench-shaped contact hole (42) by patterning the ILD (32) and the source region (11);

forming the heavily doped diffusion region (12) of the second conductivity type at the bottom of the contact hole (42) through ion implantation and annealing, and forming the source electrode (22) on the front of the wafer and the drain electrode (23) on the back of the wafer.

Further, the body region (13) is formed by single or multiple times of ion implantation and then annealing.

Further, the body region (13) is formed by epitaxial growth.

Further, the polysilicon source region (11) is formed by chemical vapor deposition.

Further, the polysilicon source region (11) is formed by depositing and then annealing amorphous silicon to convert the amorphous silicon into polysilicon.

Further, the polysilicon source region (11) is formed by depositing amorphous silicon and converting the amorphous silicon into polysilicon in the process of forming the gate dielectric (31).

Further, the trench-shaped contact hole (42) is formed by photolithography and then etching.

Further, the gate dielectric (31) is a dielectric with a high dielectric constant formed by deposition.

Further, the trench-shaped contact hole (42) is formed by photolithography and then etching.

Further, the etching is dry etching, including, but not limited to, deep reactive ion etching.

Further, the source electrode (22) is formed by deposition, including, but not limited to, sputtering, evaporation and electroplating.

Further, the gate electrode (21) is formed by depositing the polysilicon and then etching.

A method for manufacturing the IGBT structure comprises:

starting with the lightly doped substrate wafer (14) of the first conductivity type, forming the body region (13) of the second conductivity type on the top of the substrate (14);

forming the heavily doped polysilicon emitter region (11) of the first conductivity type on the top of the body region (13), forming the gate trench (41) by patterning the polysilicon emitter region (11) and the body region (13), forming the gate dielectric (31) in the gate trench (41) and on the upper surface of the polysilicon emitter region (11), forming the gate electrode (21) by deposition and then etching, depositing the ILD (32) on the top of the gate electrode (21) and on the surface of the emitter region (11), forming the trench-shaped contact hole (42) by patterning the ILD (32) and the emitter region (11), forming the heavily doped diffusion region (12) of the second conductivity type at the bottom of the contact hole (42) through ion implantation and annealing, forming the emitter electrode (24) on the front of the wafer, thinning down the substrate wafer (14) on the back of the wafer, forming the buffer region (16) of the first conductivity type and the heavily doped collector region (17) of the second conductivity type on the back of the wafer, and forming the collector electrode (25) collector electrode (25) on the back of the wafer.

Further, the body region (13) is formed by single or multiple times of ion implantation and then annealing.

Further, the body region (13) is formed by epitaxial growth.

Further, the polysilicon emitter region (11) is formed by chemical vapor deposition.

Further, the polysilicon emitter region (11) is formed by depositing and then annealing amorphous silicon to convert the amorphous silicon into polysilicon. 30. The method for manufacturing the IGBT structure of claim 25, wherein the polysilicon emitter region (11) is formed by depositing amorphous silicon and converting the amorphous silicon into polysilicon in the process of forming the gate dielectric (31).

Further, the trench-shaped contact hole (42) is formed by photolithography and then etching.

Further, the gate dielectric (31) is a dielectric with a high dielectric constant formed by deposition.

Further, the trench-shaped contact hole (42) is formed by photolithography and then etching.

Further, the etching is dry etching, including, but not limited to, deep reactive ion etching.

Further, the emitter electrode (24) is formed by deposition, including, but not limited to, sputtering, evaporation and electroplating.

Further, the gate electrode (21) is formed by depositing the polysilicon and then etching.

A method for manufacturing the IGBT structure comprises:

starting with the lightly doped substrate wafer (14) of the first conductivity type, forming the body region (13) of the second conductivity type on the top of the substrate (14);

forming the heavily doped polysilicon emitter region (11) of the first conductivity type on the top of the body region (13), forming the gate trench (41) by patterning the polysilicon emitter region (11) and the body region (13), forming the gate dielectric (31) in the gate trench (41) and on the upper surface of the polysilicon emitter region (11), forming the gate electrode (21) by deposition and then etching, depositing the ILD (32) on the top of the gate electrode (21) and on the surface of the emitter region (11), thinning down the substrate wafer (14) on the back of the wafer, forming the buffer region (16) of the first conductivity type and the heavily doped collector region (17) of the second conductivity type on the back of the wafer, and forming the trench-shaped contact hole (42) by patterning the ILD (32) and the emitter region (11), forming the heavily doped diffusion region (12) of the second conductivity type at the bottom of the contact hole (42) through ion implantation and annealing, and forming the emitter electrode (24) on the front of the wafer and the collector electrode (25) on the back of the wafer.

Further, the body region (13) is formed by single or multiple times of ion implantation and then annealing.

Further, the body region (13) is formed by epitaxial growth.

Further, the polysilicon emitter region (11) is formed by chemical vapor deposition.

Further, the polysilicon emitter region (11) is formed by depositing and then annealing amorphous silicon to convert the amorphous silicon into polysilicon.

Further, the polysilicon emitter region (11) is formed by depositing amorphous silicon and converting the amorphous silicon into polysilicon in the process of forming the gate dielectric (31).

Further, the gate dielectric (31) is silicon oxide formed by oxidation or deposition.

Further, the gate dielectric (31) is a dielectric with a high dielectric constant formed by deposition.

Further, the trench-shaped contact hole (42) is formed by photolithography and then etching.

Further, the etching is dry etching, including, but not limited to, deep reactive ion etching.

Further, the emitter electrode (24) is formed by deposition, including, but not limited to, sputtering, evaporation and electroplating.

Further, the gate electrode (21) is formed by depositing the polysilicon and then etching.

BRIEF DESCRIPTION OF THE DRAWINGS

FIG. 8A to FIG. 8I show a method for manufacturing the trench gate IGBT as previously shown in FIG. 6.

FIG. 9A to FIG. 9H show another method for manufacturing the trench gate IGBT as previously shown in FIG. 6.

DETAILED DESCRIPTION

Figure 1:
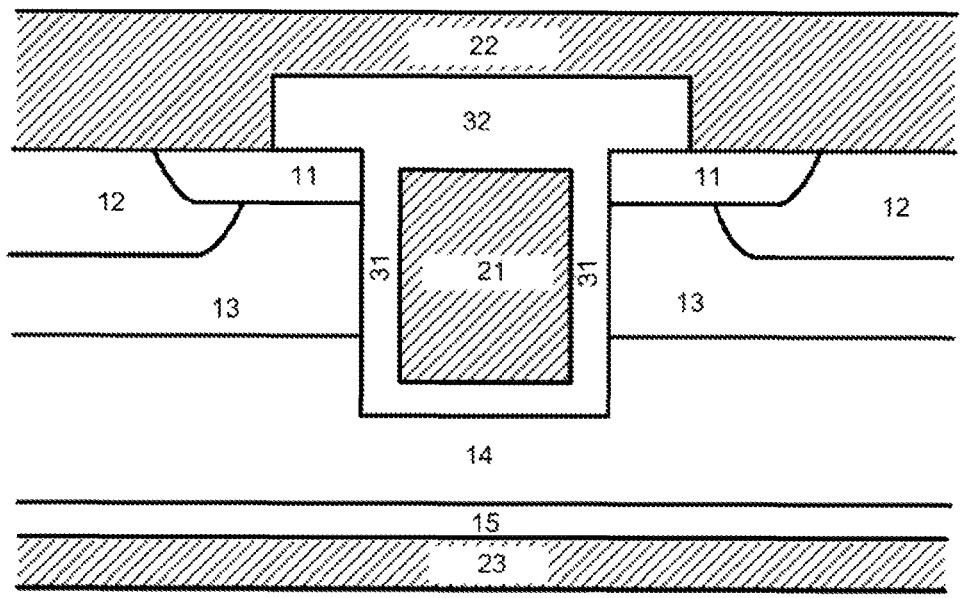
FIG. 1 is a cross sectional view of a TMOS structure in the prior art.

FIG. 1 is a cross sectional view of a TMOS structure in the prior art. In the device, about half of an $n^+$ source region (11) is covered by an interlayer dielectric (ILD) (32), and the remaining $n^-$ source region (11) is contacted by a source electrode (22). The source electrode (22) is isolated from a gate electrode (21) by the ILD (32).

Figure 2:
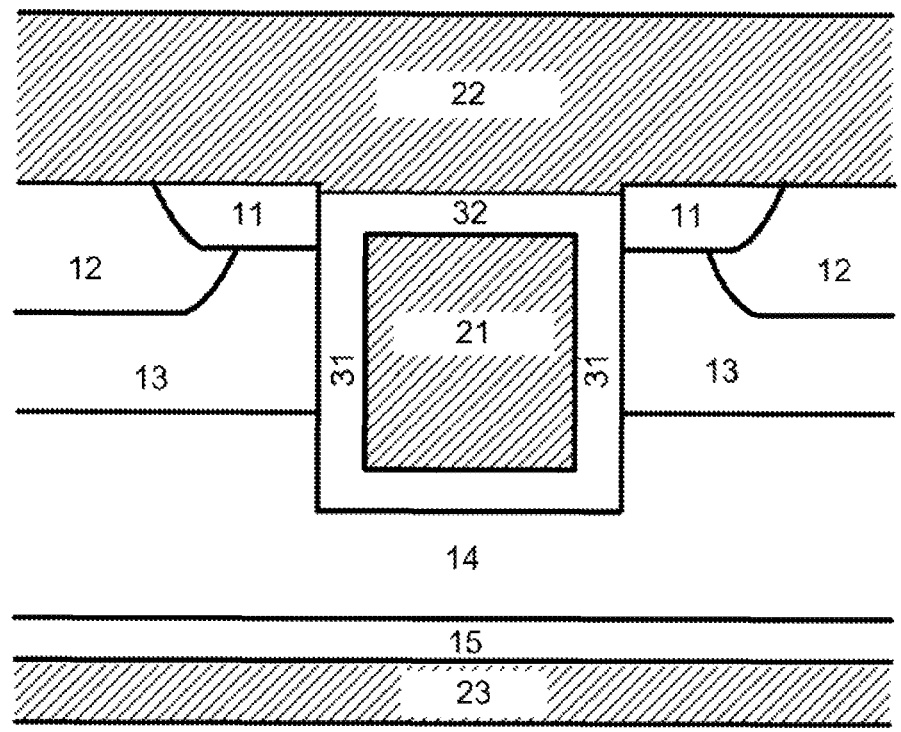
FIG. 2 is a cross sectional view of a trench gate TMOS structure in the prior art.

FIG. 2 is a cross sectional view of a trench gate TMOS structure in the prior art. In the device, all of the ILD (32) is located in a trench, and the whole upper surface of the $n^+$ source region (11) is contacted by the source electrode (22).

Figure 3:
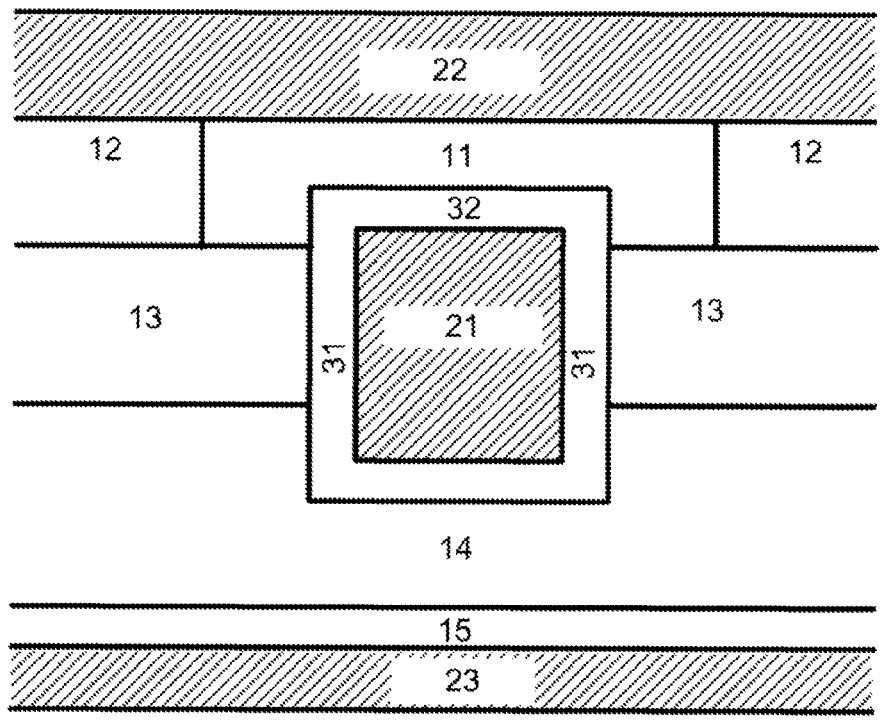
FIG. 3 is a cross sectional view of a buried gate TMOS structure in the prior art.

FIG. 3 is a cross sectional view of a buried gate TMOS structure in the prior art. In the device, all of the ILD (32) is located in a trench, and the whole upper surface of the $n^+$ source region (11) is contacted by the source electrode (22). In addition, part of the $n^+$ source region (11) is located on the top of the ILD (32), and this part of $n^+$ source region (11) is polysilicon.

Figure 4:
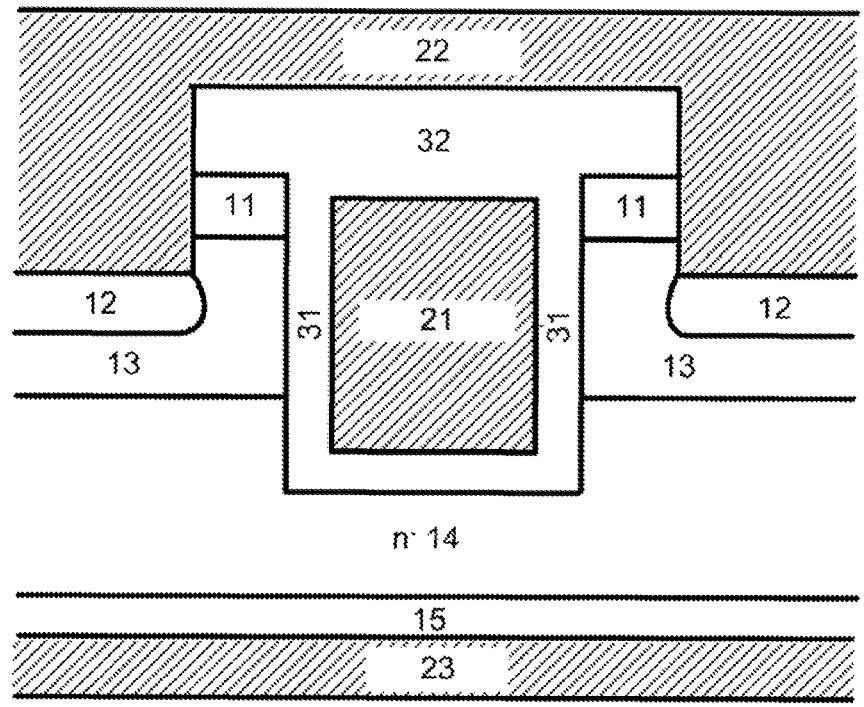
FIG. 4 is a cross sectional view of a TMOS structure with a trench-shaped source contact hole in the prior art.

FIG. 4 is a cross sectional view of a TMOS structure with a trench-shaped source contact hole in the prior art. In the device, the $n^+$ source region (11) is contacted by the source electrode (22) on the side wall of the trench-shaped source contact hole.

Figure 5:
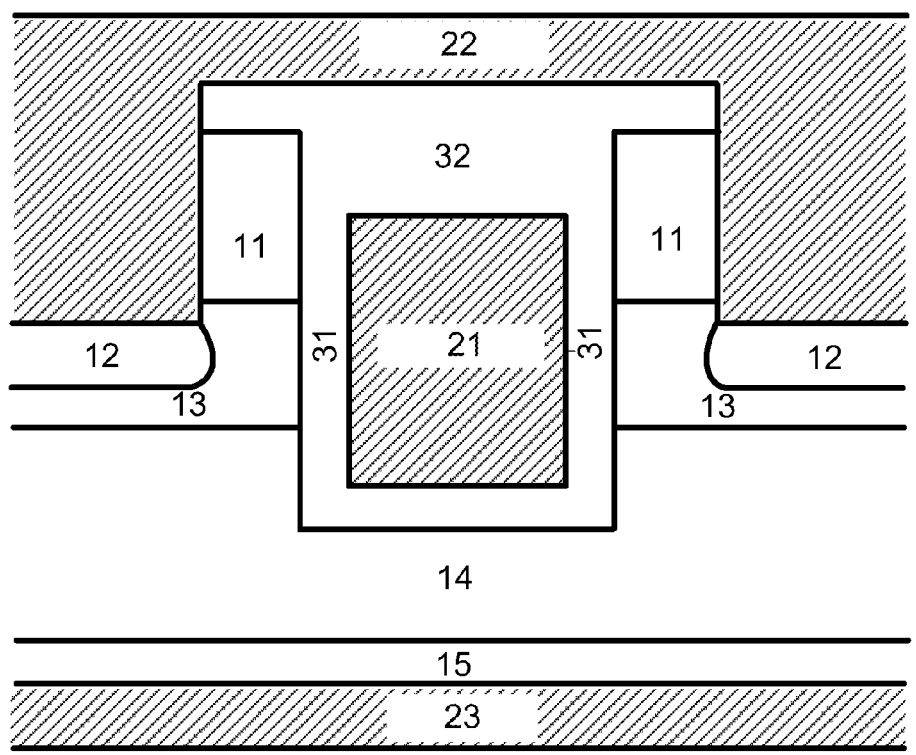
FIG. 5 is a cross sectional view of the present invention implemented in a TMOS structure.

FIG. 5 is a cross sectional view of the present invention implemented in a trench gate power MOSFET structure. The trench gate power MOSFET structure comprises a drain electrode (23) at the bottom; an $n^+$ substrate (15) on the top of the drain electrode (23); an $n^-$-epi (14) on the top of the $n^+$ substrate (15); a p-type body region (13) on the top of the $n^-$-epi (14); a $p^+$ diffusion (12) which connects the p-type body region (13) to a source electrode (22); the source electrode (22) which is positioned in a trench-shaped contact hole (42) and on the top of the device; a polysilicon $n^+$ source region (11) which is positioned on the top of the p-type body region (13) and contacts with the source electrode (22) at the side wall of the contact hole (42); a gate dielectric (31) which covers the side wall surface of the p-type body region (13) and forms a channel between the $n^+$ source region (11) and the $n^-$-epi(14); a gate electrode (21) which is close to the gate dielectric (31) in a gate trench (41); and an interlayer dielectric (ILD) (32) which covers the upper surfaces of both the gate electrode (21) and the $n^+$ source region (11). The drain electrode (23) and the source electrode (22) both should have low resistivity, and are normally metal or metal silicides, including but not limited to aluminum, copper, tungsten, titanium silicide, cobalt silicide and nickel silicide. The gate dielectric (31) is normally silicon oxide. However, in order to minimize the thermal process of manufacturing, a dielectric with high dielectric constant (e.g. hafnium dioxide and aluminum oxide) can also be used as the gate dielectric (31). $N^+$ polysilicon is normally used for the gate electrode (21) to make the device suitable for a high temperature manufacturing process. For example, in the manufacturing process, the $p^+$ diffusion (12) is formed after the gate electrode (21) is formed, and high-temperature annealing (e.g. 950° C.) is generally required in this step. However, after the high temperature process, the polysilicon can be partly or entirely transformed into metal or metal silicide, to obtain low gate resistance. The ILD (32) can be any type of dielectric, and is normally silicon oxide. In a preferred embodiment of the present invention, the p-type body region (13) has approximately uniform doping profile, to obtain low on-resistance of the device.

Figures 6, 7A:
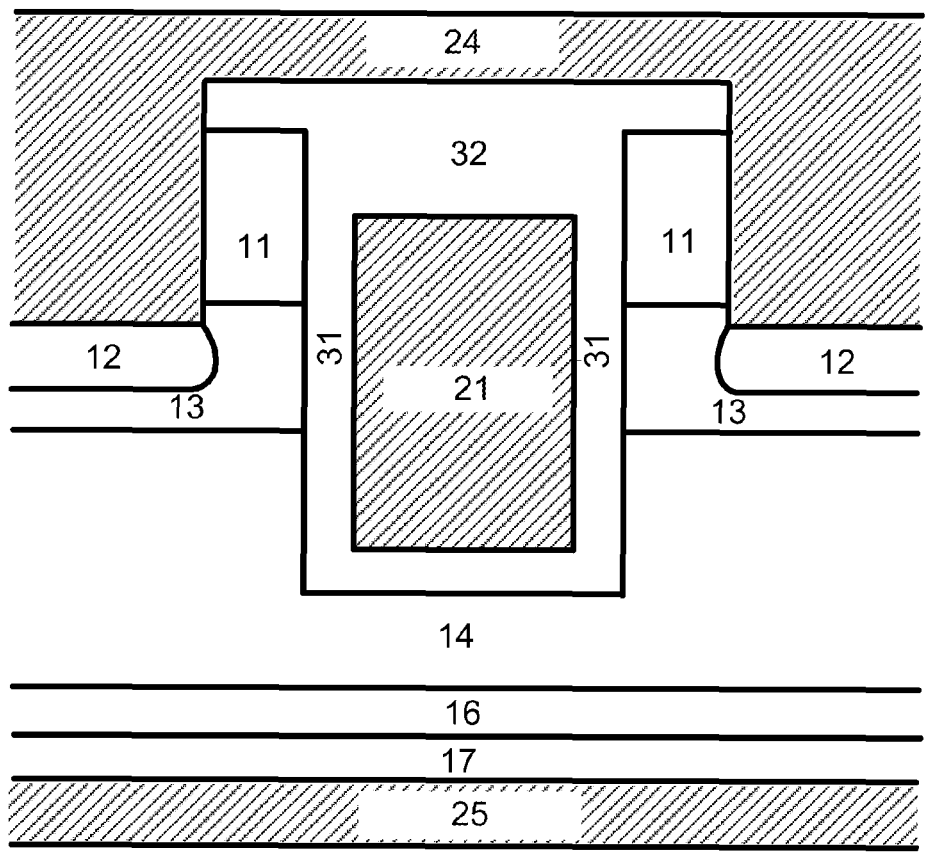
FIG. 6 is a cross sectional view of the present invention implemented in a trench gate IGBT structure.
FIG. 7A to FIG. 7G show a method for manufacturing the TMOS as previously shown in FIG. 5.

FIG. 6 is a cross sectional view of the present invention implemented in a trench gate IGBT structure. The device has a structure similar to that of the TMOS previously shown in FIG. 5. The IGBT, however, has a different wafer back structure. As shown in FIG. 6, there is a $p^-$ collector region (17) on the top of collector electrode (25) collector electrode (25), and an n buffer region (16) is located on the top of the $p^+$ collector region (17). These parts above the n buffer region (16) are the same as those above the $n^-$ substrate (15) in FIG. 5, but are differently named. The emitter electrode (24) in the IGBT is the same as the source electrode (22) in the TMOS. The $n^-$ emitter region (11) in the IGBT is the same as the $n^+$ source region (11) in the TMOS. The $n^-$ drift region (14) in the IGBT is the same as the $n^-$-epi (14) in the TMOS.

FIG. 7A to FIG. 7G show a method for manufacturing the TMOS as previously shown in FIG. 5. The manufacturing process comprises (001) starting with an epitaxial wafer having the $n^-$-epi (14) on the top of the $n^+$ substrate (15); (002) forming a p-type body region (13) on the top of the $n^-$-epi (14); (003) forming a polysilicon $n^-$ source region (11) on the top of the p-type body region (13); (004) forming a gate trench (41) by patterning the $n^+$ source region (11) and the p-type body region (13); (005) forming a gate dielectric (31) in the gate trench (41) and on the upper surface of the n$^+$ source region (11); (006) forming a gate electrode (21) by deposition and deep etching, (007) depositing the ILD (32) on the top of the gate electrode (21) and on the surface of the n$^+$ source region (11); (008) forming a trench-shaped contact hole (42) by patterning the ILD (32) and the n$^+$ source region (11); (009) forming the p$^+$ diffusion region (12) at the bottom of the contact hole (42) through ion implantation and annealing; and (010) forming a source electrode (22) on the front of the wafer and a drain electrode (23) on the back of the wafer.

FIG. 7A shows the formation of the p-type body region (13). In a preferred embodiment of the present invention, the p-type body region (13) has an approximately uniform doping profile to obtain a low on-resistance of the device. In an embodiment of the present invention, the p-type body region (13) is formed by ion implantation and annealing. In another embodiment of the present invention, the p-type body region (13) is formed by multiple times of ion implantation as well as annealing to make the doping profile closer to uniform profile. In yet another embodiment of the present invention, the p-type body region (13) is formed on the top of n$^-$-epi (14) by p-type epitaxy growth to make the doping profile closer to uniform profile.

Figure 7B:
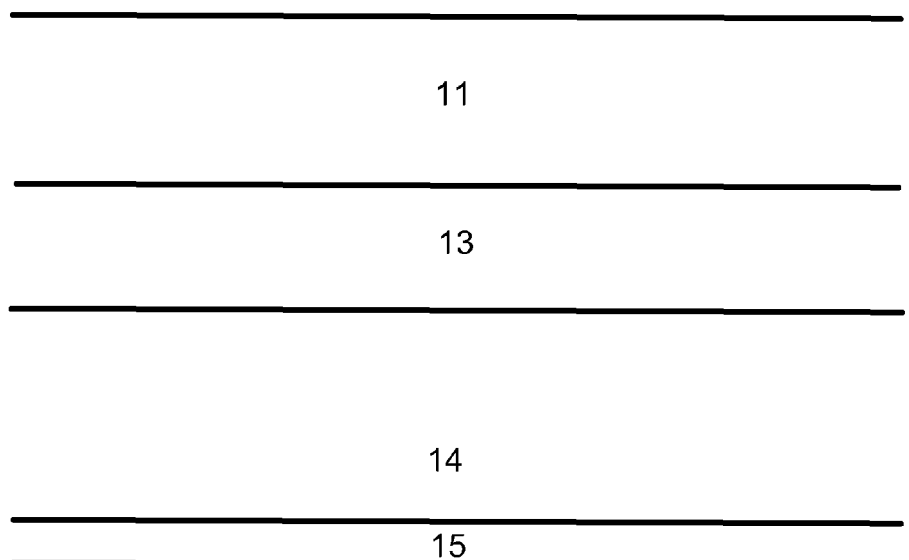

FIG. 7B shows the formation of the polysilicon n$^+$ source region (11). In an embodiment of the present invention, the polysilicon n$^+$ source region (11) is formed by chemical vapor deposition (CVD). For example, the n$^+$ source region (11) can be formed by depositing phosphorous doped polysilicon on the top of the p-type body region (13). In another embodiment of the present invention, the polysilicon n$^-$ source region (11) is formed by depositing amorphous silicon and then annealing to transform the amorphous silicon into polysilicon. The annealing temperature is usually higher than 600° C. and lower than 1100° C. For example, the amorphous silicon is doped with phosphorus and deposited through CVD or sputtering. In yet another embodiment of the present invention, the polysilicon n$^+$ source region (11) is formed by depositing amorphous silicon and transforming the amorphous silicon into polysilicon in the process of forming the dielectric (31). For example, the amorphous silicon can be transformed into polysilicon during oxidation of the dielectric (31). The oxidizing temperature (e.g. 950° C.) of silicon oxide is high enough to transform amorphous silicon into polysilicon. In addition, relatively thick silicon oxide can be obtained on the amorphous silicon surface, which will result in a reduced gate source capacitance.

Figure 7C:
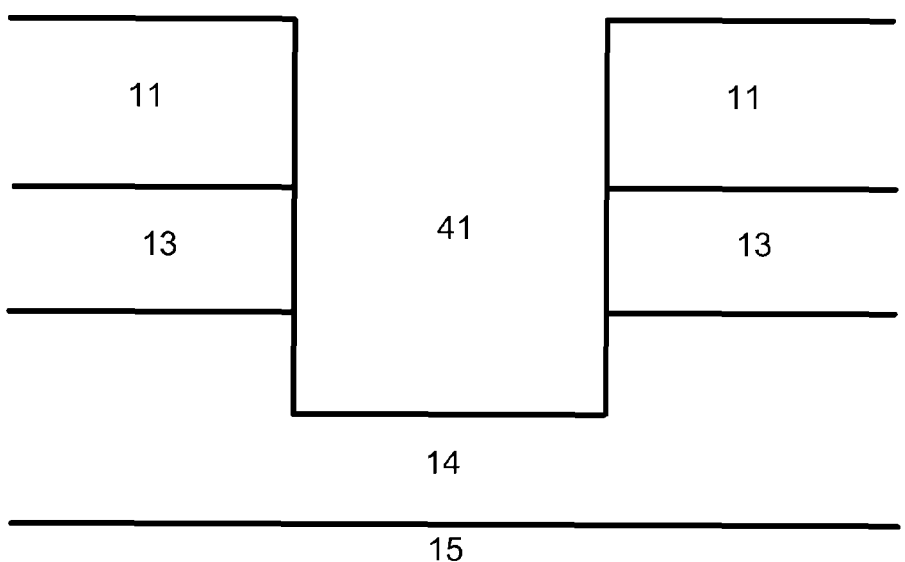

FIG. 7C shows the formation of the gate trench (41). The gate trench (41) is formed by patterning the n$^+$ source region (11) and the p-type body region (13). For example, the gate trench (41) can be formed by photolithography and then dry etching.

Figure 7D:
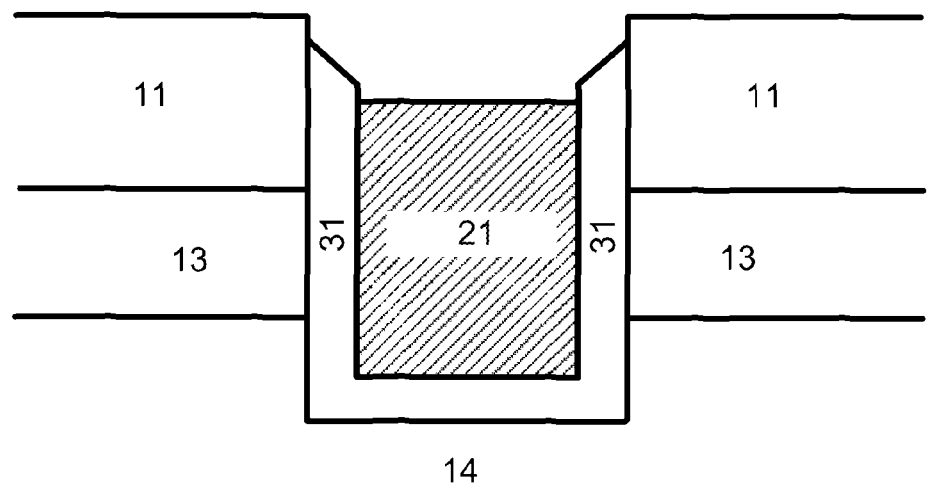

FIG. 7D shows the formation of the gate dielectric (31) and the gate electrode (21). In an embodiment of the present invention, the gate dielectric (31) is silicon oxide formed by oxidation or deposition. Thermal oxides have high quality, but deposited oxides have a low thermal budget. In another embodiment of the present invention, the gate dielectric (31) is a dielectric with a high dielectric constant formed by deposition, and the thermal budget can be kept low. The gate electrode (21) is generally heavily doped polysilicon (e.g. phosphorous doped polysilicon), and the gate electrode (21) is formed by deposition and then deep etching. After the polysilicon is deeply etched, the gate dielectric (31) on the n$^+$ source region (11) can be kept or partially kept. Nonetheless, this makes no difference to the following steps, for the reason that the gate dielectric (31) has electrical properties that are substantially the same as those of the ILD (32). Even though some gate dielectric (31) remains on the n$^-$ source region (11) subsequent to the deep etching of the polysilicon, the gate dielectric (31), together with the ILD (32), can still be patterned in the etching process of the trench-shaped contact hole (42), and insignificant changes of the electrical properties of the device are aroused. In addition, alternatively, after the p$^-$ diffusion (12) is formed, the polysilicon of the gate can also be completely or partially replaced by metals or metal silicides, to obtain low gate resistance.

Figure 7E:
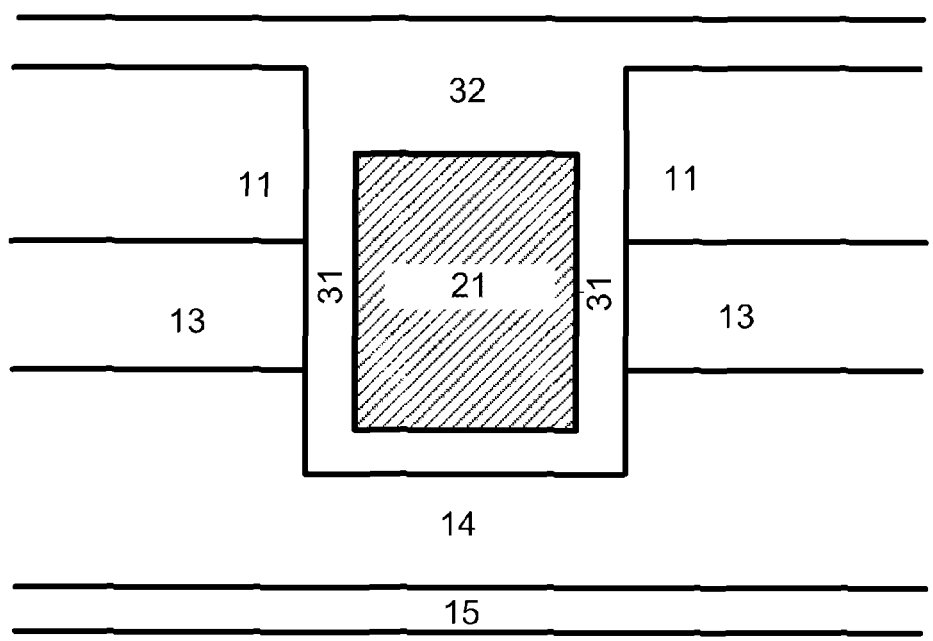

FIG. 7E shows the formation of the ILD (32). The ILD (32) is generally silicon oxide. For example, the ILD (32) is silicon oxide formed by CVD. Yet, the ILD (32) may be any type of dielectric. For example, to decrease the parasitic gate source capacitance, a dielectric with a low dielectric constant may be employed.

Figure 7F:
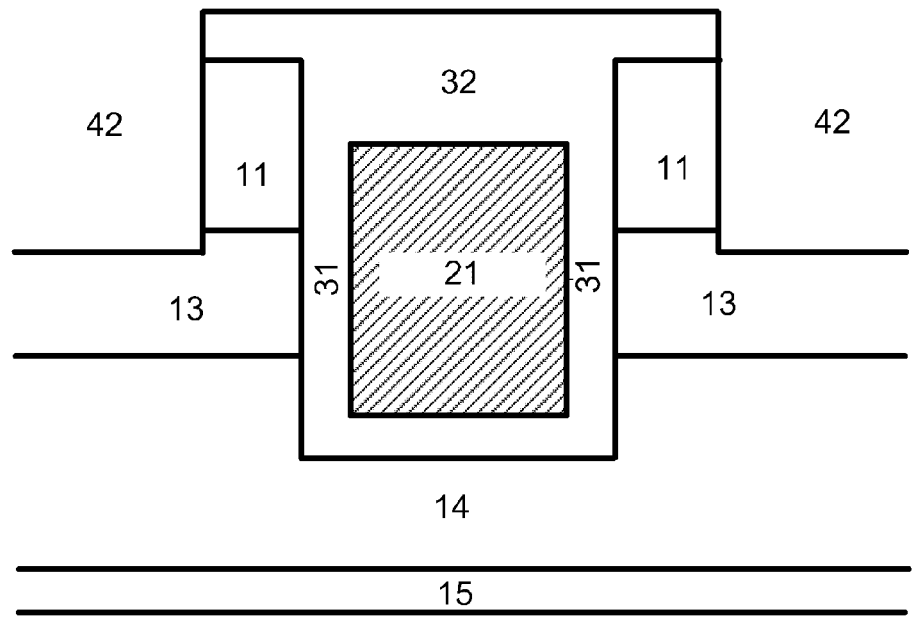

FIG. 7F shows the formation of the trench-shaped contact hole (42). The contact hole (42) is a trench formed by patterning the ILD (32) and the n$^+$ source region (11). Generally patterning includes photolithography and subsequent etching. In an embodiment of the present invention, etching for the contact hole (42) is dry etching. For example, the trench-shaped contact hole (42) can be obtained by a current advanced technology, namely deep reactive ion etching (DRIE) in a ratio of width to height being about 1:20. By using the DRIE, even if under the condition that the cell pitch is significantly reduced, the contact resistance of the source can also remain low. After the contact hole (42) is formed, the p$^+$ diffusion (12) is formed by ion implantation and annealing. For example, ion implantation can be performed by using the ILD (32) as a hard mask. As a further example, after photolithography and etching of the contact hole (42), a photoresist can be kept as a mask for ion implantation, and the photoresist is removed after the ion implantation.

Figure 7G:
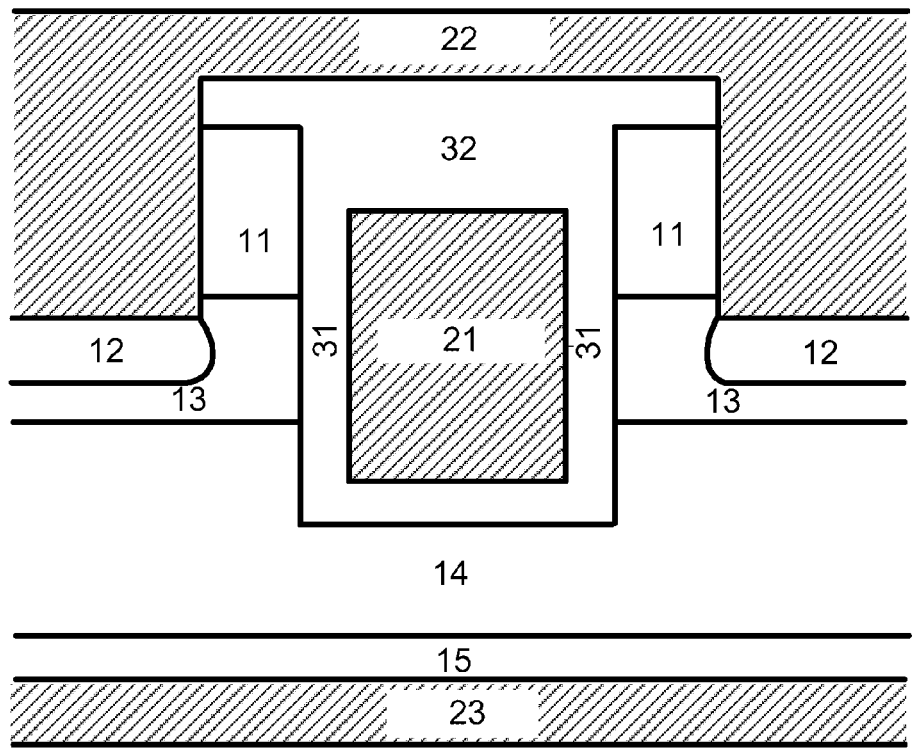

FIG. 7G shows the formation of the source electrode (22) on the front of the wafer and the formation of the drain electrode (23) on the back of the wafer. In an embodiment of the present invention, the source electrode (22) is formed by deposition. For example, the source electrode (22) can be formed by common sputtering or evaporation. For another example, the source electrode (22) can also be formed by electroplating, so that the trench-shaped contact hole (42) can be filled in a high ratio of width to height. On the other hand, the drain electrode (23) is generally formed by sputtering or evaporation.

FIG. 8A to FIG. 8I show a method for manufacturing the trench gate IGBT as previously shown in FIG. 6. The manufacturing process comprises: (001) starting with the n$^-$ substrate wafer (14); (002) forming the p-type body region (13) on the top of the n$^+$ substrate (14); (003) forming the polysilicon n$^+$ emitter region (11) on the top of the p-type body region (13); (004) forming the gate-trench (41) by patterning the n$^+$ emitter region (11) and the p-type body region (13); (005) forming the gate dielectric (31) in the gate trench (41) and on the upper surface of the n$^-$ emitter region (11); (006) forming the gate electrode (21) by deposition and deep etching: (007) depositing the ILD (32) on the top of the gate electrode (21) and on the surface of the n$^+$ emitter region (11); (008) forming the trench-shaped contact hole (42) by patterning the ILD (32) and the n$^+$ emitter region (11); (009) forming the p$^-$ diffusion (12) at the bottom of the contact hole (42) by implantation and annealing; (010) forming the emitter electrode (24) on the front of the wafer;

(011) thinning down the n⁻ substrate wafer (14) on the back of the wafer; (012) forming the n buffer region (16) and the p⁺ collector region (17) on the back of the wafer; and (013) forming the collector electrode (25) on the back of the wafer. The same technique applied in the manufacturing process of the TMOS is also applicable to the manufacturing process of the IGBT.

The steps shown in FIG. 8A to FIG. 8G are similar to those of the power MOSFET, except the use of the n⁻ substrate wafer (14) for replacing the epitaxial wafer.

Figures 8A, 8B:
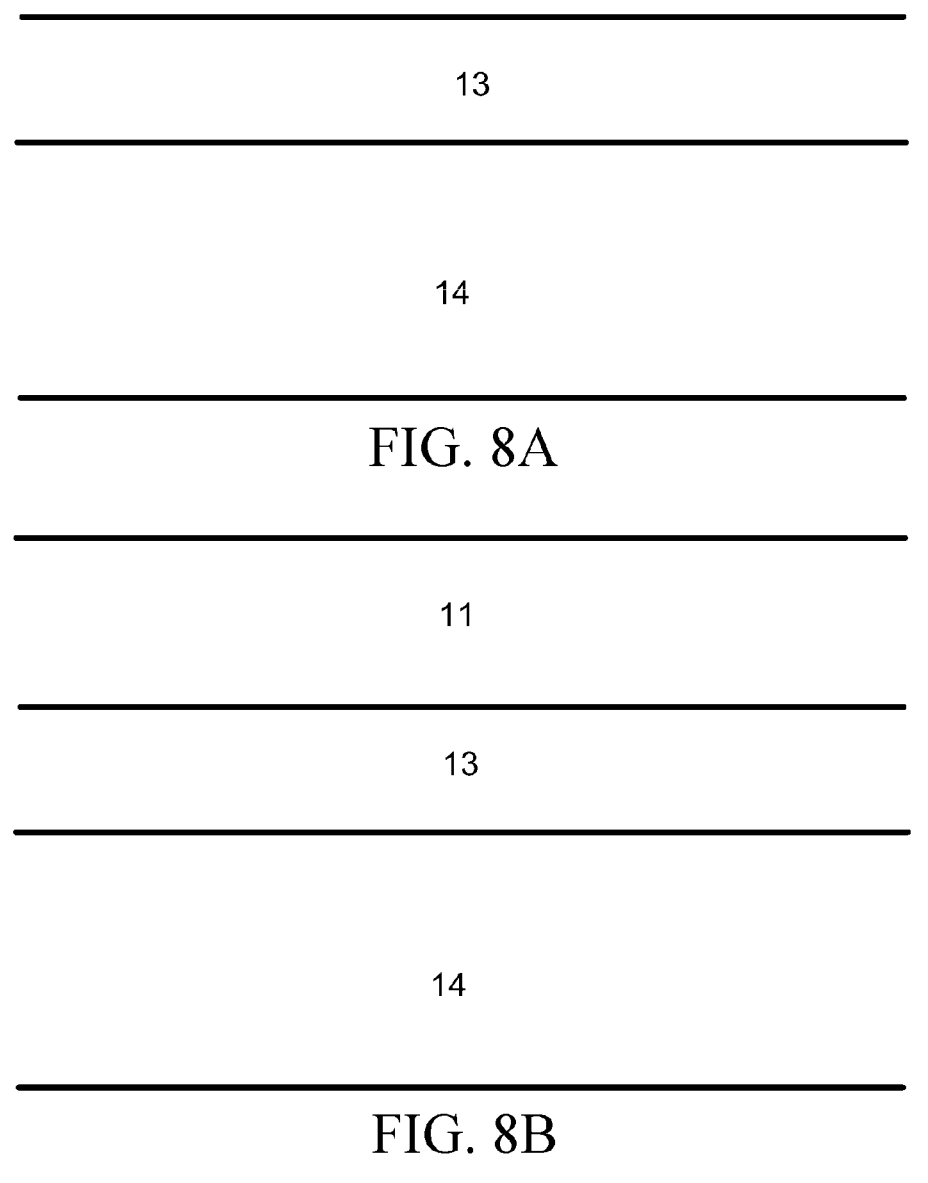
Figure 8C:
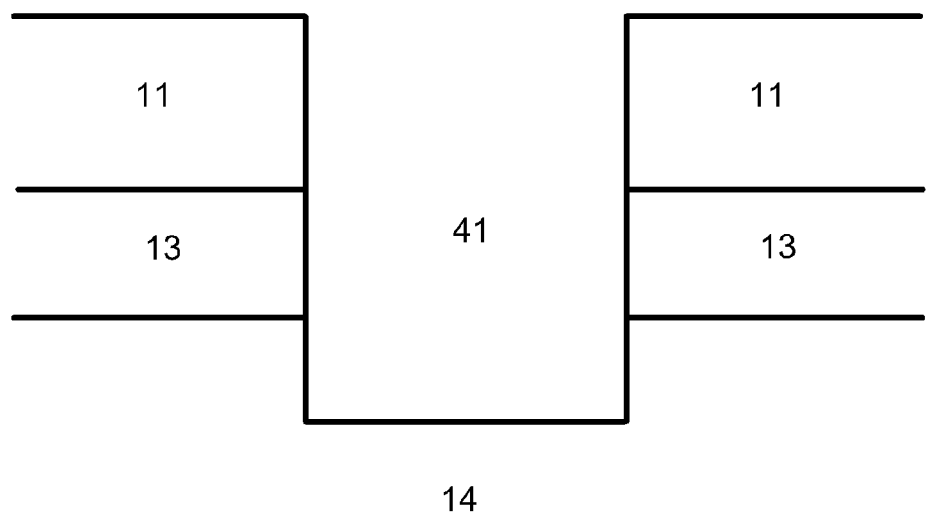
Figure 8D:
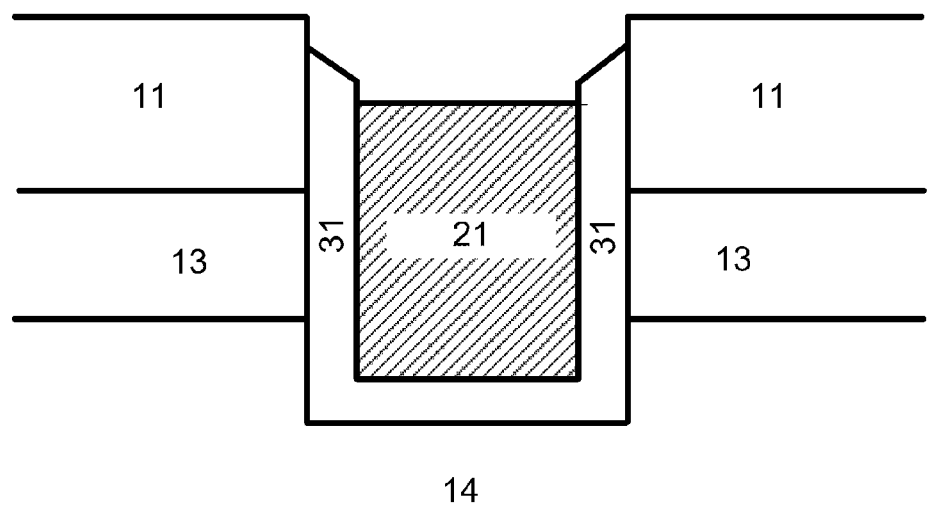
Figure 8E:
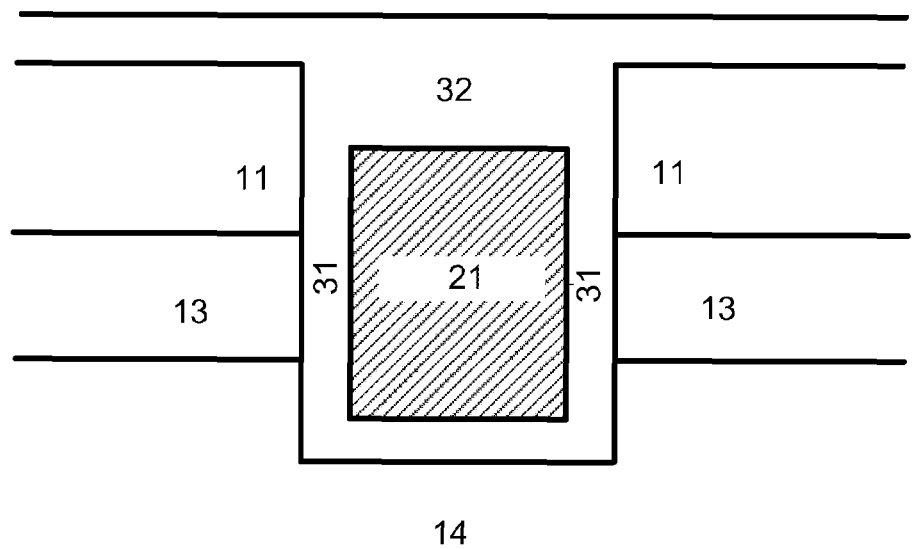
Figure 8F:
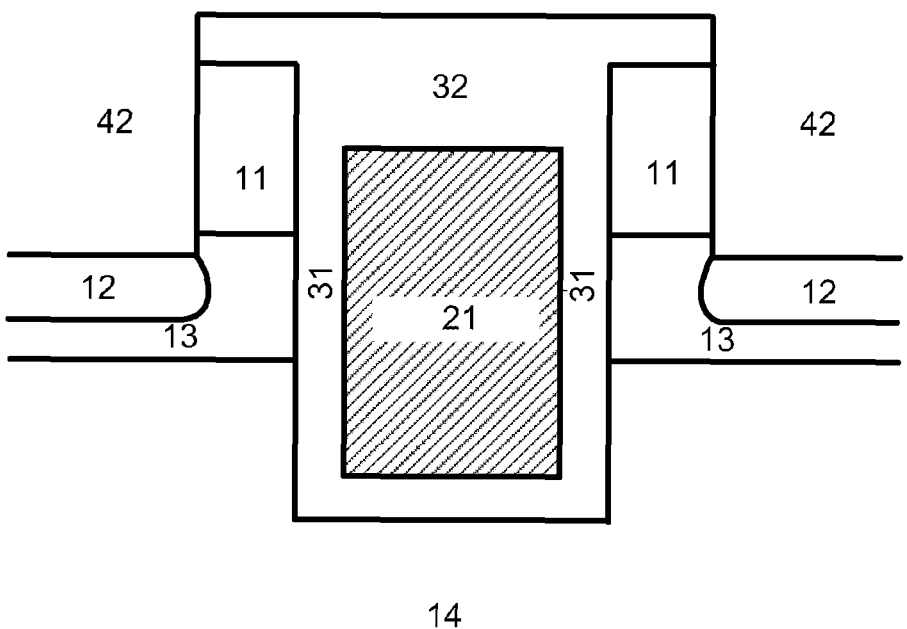
Figure 8G:
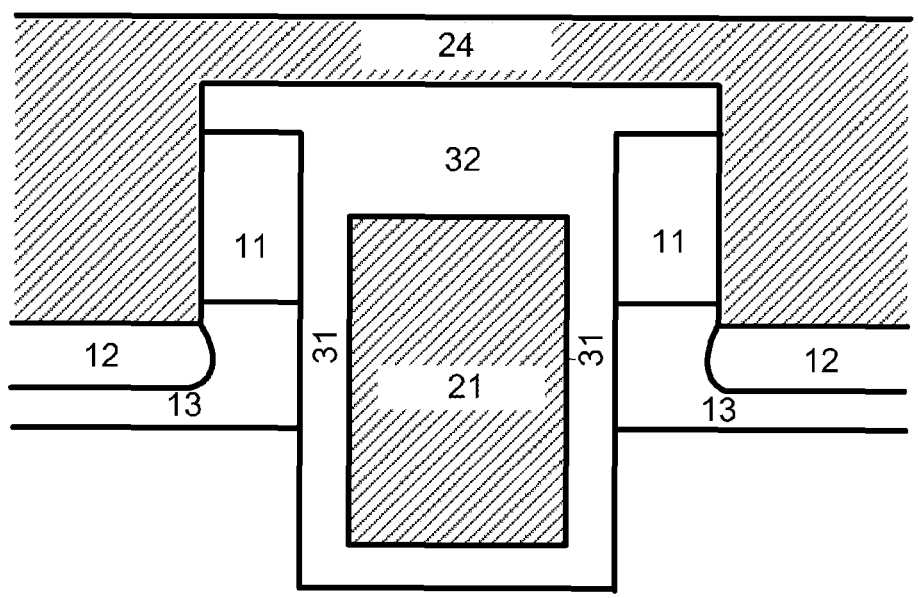
Figure 8H:
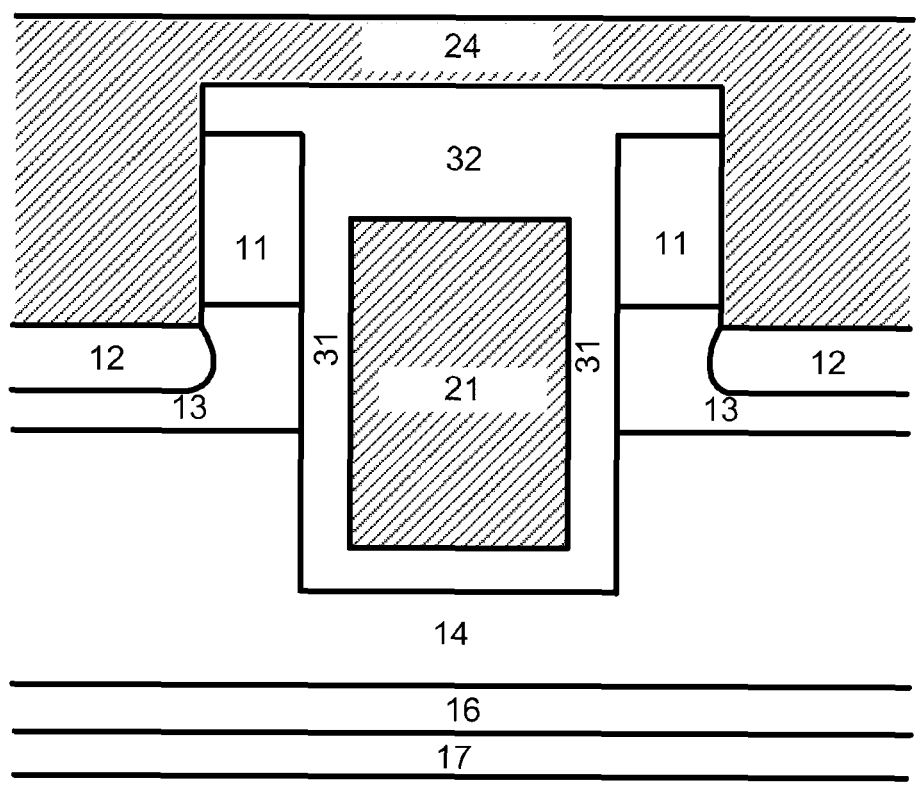

FIG. 8H shows the formation of the n buffer region (16) and the p⁺ collector region (17) on the back of the wafer. Before the formation of the n buffer region (16) and the p⁺ collector region (17) the substrate wafer (14) is thinned down on the back to decrease the thickness to be a target value. For example, the wafer thickness of the 600V IGBT is about 60 μm. The n buffer region (16) and the p⁺ collector region (17) are generally formed by ion implantation and annealing. Due to the metal on the front of the wafer, the annealing is generally carried out at a low temperature (e.g. 480 DEG C.).

Figures 8I, 9A:
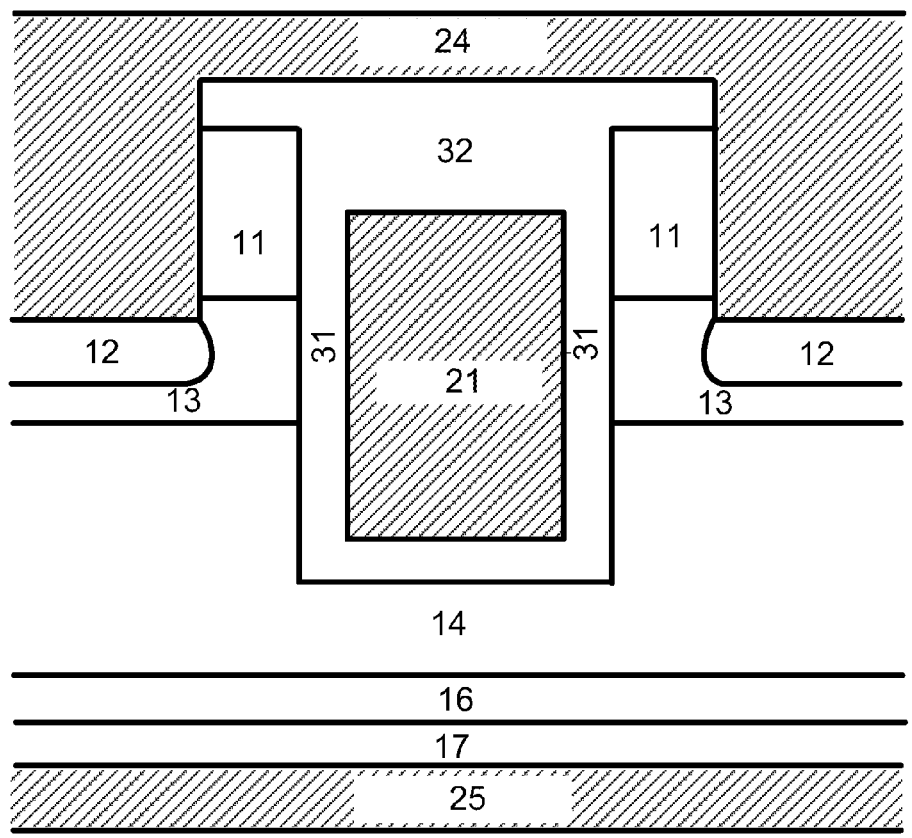

FIG. 8I shows the formation of the collector electrode (25) collector electrode (25). The collector electrode (25) collector electrode (25) is generally formed by sputtering or evaporating.

FIG. 9A to FIG. 9H show another method for manufacturing the trench gate IGBT as previously shown in FIG. 6. The manufacturing process comprises: (001) starting with the n⁻ substrate wafer (14); (002) forming the p-type body region (13) on the top of the n⁻ substrate (14); (003) forming the polysilicon n⁺ emitter region (11) on the top of the p-type body region (13); (004) forming the gate trench (41) by patterning the n⁺ emitter region (11) and the p-type body region (13); (005) forming the gate dielectric (31) in the gate trench (41) and on the upper surface of the n⁺ emitter region (11); (006) forming the gate electrode (21) by deposition and deep etching; (007) depositing the ILD (32) on the top of the gate electrode (21) and on the surface of the n⁺ emitter region (11); (008) thinning down the n⁻ substrate wafer (14) on the back of the wafer; (009) forming the n buffer region (16) and the p⁺ collector region (17) on the back of the wafer; (010) forming the trench-shaped contact hole (42) by patterning the ILD (32) and the n⁺ emitter region (11); (011) forming the p⁻ diffusion (12) at the bottom of the contact hole (42) by implantation and annealing; (012) forming the emitter electrode (24) on the front of the wafer and the collector electrode (23) on the back of the wafer. The same technique applied in the manufacturing process of the TMOS is also applicable to the manufacturing process of the IGBT.

The steps shown in FIG. 9A to FIG. 9E are similar to those of the power MOSFET, except the use of the n⁻ substrate wafer (14) for replacing the epitaxial wafer.

Figure 9D:
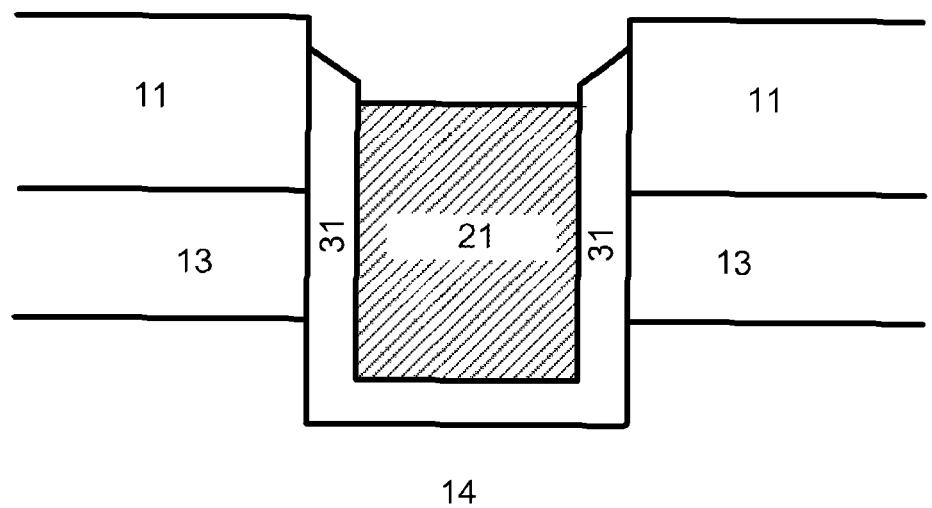
Figure 9E:
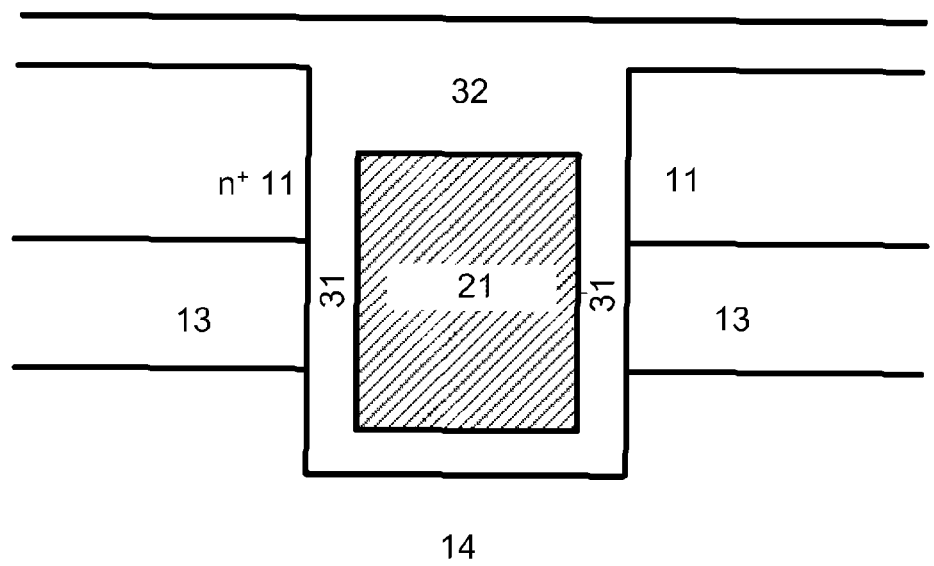
Figure 9F:
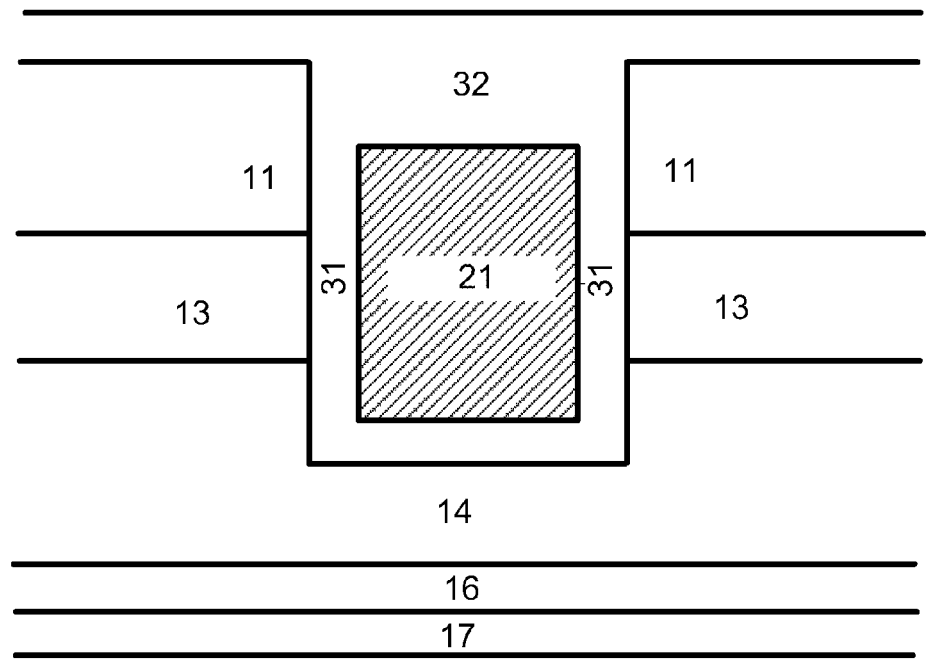

FIG. 9F shows the formation of the n buffer region (16) and the p⁺ collector region (17) on the back of the wafer, which are thinned on the back of the wafer before the formation to reduce the thickness of the substrate wafer (14) to the object value. For example, the wafer thickness of the 600V IGBT is about 60 μm. The n buffer region (16) and the p⁺ collector region (17) are generally formed by ion implantation and annealing. Since there is no metal on the wafer at this step, the annealing may be performed on the n buffer region (16) and the p⁺ collector region (17) at a high temperature (e.g. 1050° C.), and almost all impurities can be activated herein.

Figure 9G:
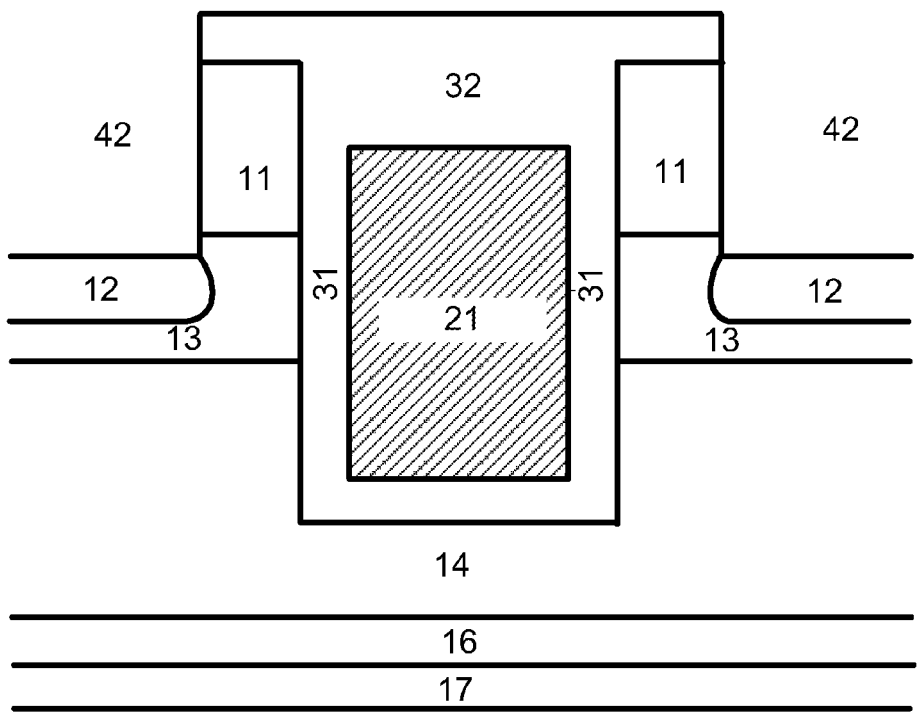

FIG. 9G shows the formation of the trench-shaped contact hole (42) and the p⁺ diffusion (12). This step is similar to the step of the TMOS. However, the step here needs the capability of processing the thin wafer, since the wafer has been thinned.

Figure 9H:
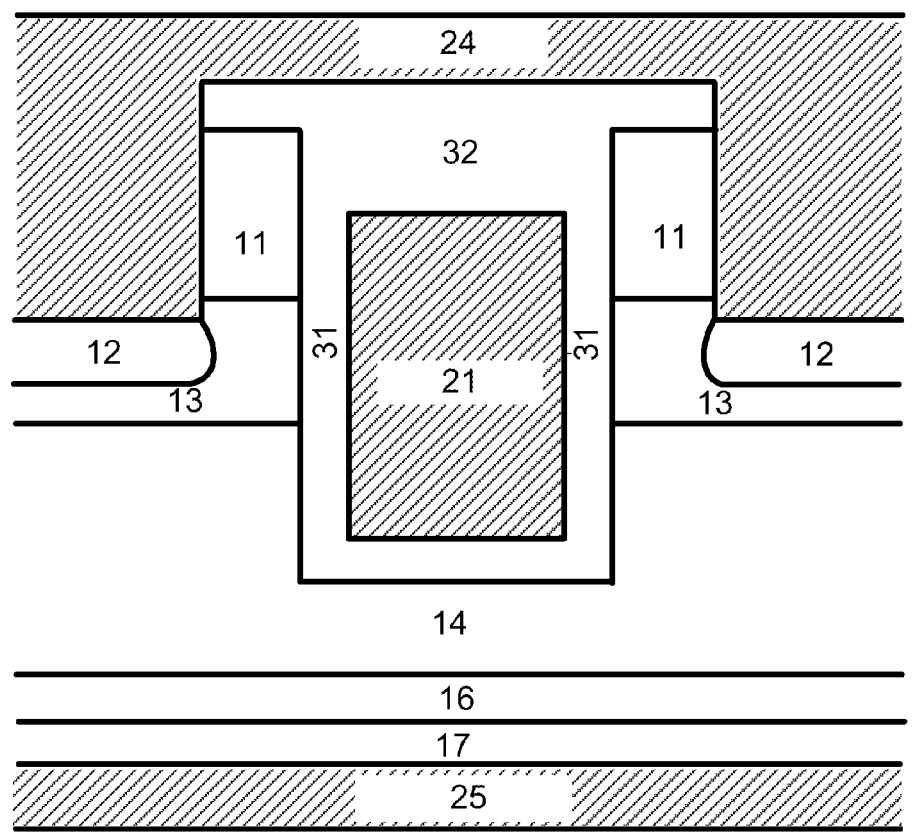

FIG. 9H shows the formation of the emitter electrode (24) and the collector electrode (25) collector electrode (25). This step is similar to the formation of the source electrode (22) and the drain electrode (23) of the TMOS.

What is claimed is:

1. A trench gate power MOSFET structure, comprising:
   a drain electrode at a bottom,
   a heavily doped substrate of a first conductivity type, the heavily doped substrate being located on a top of the drain electrode,
   a lightly doped epitaxial layer of the first conductivity type, the lightly doped epitaxial layer being located on a top of the heavily doped substrate,
   a body region of a second conductivity type, the body region being located on a top of the epitaxial layer,
   a heavily doped diffusion region of the second conductivity type, the heavily doped diffusion region connecting the body region to a source electrode,
   the source electrode, the source electrode being located in a trench-shaped contact hole and also on a top of a device,
   a heavily doped polysilicon source region of the first conductivity type, the heavily doped polysilicon source region being located on a top of the body region and contacted by the source electrode on a side wall of the trench-shaped contact hole,
   a gate dielectric, the gate dielectric covering a surface of a side wall of the body region and forming a channel between the source region and the epitaxial layer,
   a gate electrode, the gate electrode being close to the gate dielectric in a gate trench, and
   an interlayer dielectric (ILD), the ILD covering an upper surface of the gate electrode and an upper surface of the source region.

2. The trench gate power MOSFET structure according to claim 1, wherein the gate dielectric is silicon oxide or a dielectric with a high dielectric constant, including, but not limited to, hafnium dioxide and aluminum oxide.

3. The trench gate power MOSFET structure according to claim 1, wherein the gate electrode is at least one of polysilicon, metal and metal silicide.

4. The trench gate power MOSFET structure according to claim 1, wherein the ILD is silicon oxide.

5. The trench gate power MOSFET structure according to claim 1, wherein the body region has an approximately uniform doping profile.

6. The trench gate power MOSFET structure according to claim 1, wherein the source electrode and the drain electrode are metals or metal silicides, including, but not limited to, aluminum, copper, tungsten, titanium silicides, cobalt silicides and nickel silicides.

7. A trench gate IGBT structure, comprising:
   a collector electrode at a bottom,
   a heavily doped collector region of a second conductivity type, the heavily doped collector region being located on a top of the collector electrode,
   a buffer region of a first conductivity type, the buffer region being located on a top of the collector region,
   a lightly doped drift region of the first conductivity type, the lightly doped drift region being located on a top of the buffer region,
   a body region of the second conductivity type, the body region being located on a top of the drift region, a heavily doped diffusion region of the second conductivity type, the heavily doped diffusion region connecting the body region to an emitter electrode, the emitter electrode, the emitter electrode being located in a trench-shaped contact hole and also on a top of a device, a heavily doped polysilicon emitter region of the first conductivity type, the heavily doped polysilicon emitter region being located on a top of the body region and contacted by the emitter electrode on a side wall of the trench-shaped contact hole, a gate dielectric, the gate dielectric covering a surface of a side wall of the body region and forming a channel between the emitter region and the drift region, a gate electrode, the gate electrode being close to the gate dielectric in a gate trench, and an interlayer dielectric (ILD), the ILD covering an upper surface of the gate electrode and an upper surface of the emitter region.

8. The trench gate IGBT structure according to claim 7, wherein the emitter electrode and the collector electrode are metals or metal silicides, including, but not limited to, aluminum, copper, tungsten, titanium silicides, cobalt silicides and nickel silicides.

9. The trench gate IGBT structure according to claim 7, wherein the gate dielectric is silicon oxide or a dielectric with a high dielectric constant, including, but not limited to, hafnium dioxide and aluminum oxide.

10. The trench gate IGBT structure according to claim 7, wherein the gate electrode is at least one of polysilicon, metal and metal silicide.

11. The trench gate IGBT structure according to claim 7, wherein the ILD is silicon oxide.

12. The trench gate IGBT structure according to claim 7, wherein the body region has an approximately uniform doping profile.

13. A method for manufacturing a trench gate power MOSFET structure, comprising:
starting with an epitaxial wafer, wherein a lightly doped epitaxial layer of a first conductivity type is located on a top of the heavily doped substrate of the first conductivity type,
forming a body region of a second conductivity type on a top of the epitaxial layer;
forming a heavily doped polysilicon source region of the first conductivity type on a top of the body region,
forming the gate trench by patterning the polysilicon source region and the body region,
forming a gate dielectric in the gate trench and on an upper surface of the polysilicon source region,
forming a gate electrode by deposition and deep etching;
depositing a ILD on a top of the gate electrode and on the surface of the source region;
forming a trench-shaped contact hole by patterning the ILD and the source region;
forming a heavily doped diffusion region of the second conductivity type at the bottom of the contact hole through ion implantation and annealing, and
forming the source electrode on a front of the wafer and the drain electrode on a back of the wafer.

14. The method for manufacturing the trench gate power MOSFET structure according to claim 13, wherein the body region is formed by single or multiple times of ion implantation and then annealing.

15. The method for manufacturing the trench gate power MOSFET structure according to claim 13, wherein the body region is formed by epitaxial growth.

16. The method for manufacturing the trench gate power MOSFET structure according to claim 13, wherein the polysilicon source region is formed by chemical vapor deposition.

17. The method for manufacturing the trench gate power MOSFET structure according to claim 13, wherein the polysilicon source region is formed by depositing and then annealing amorphous silicon to convert the amorphous silicon into polysilicon.

18. The method for manufacturing the trench gate power MOSFET structure according to claim 13, wherein the polysilicon source region is formed by depositing amorphous silicon and converting the amorphous silicon into polysilicon in the process of forming the gate dielectric.

19. The method for manufacturing the trench gate power MOSFET structure according to claim 13, wherein the trench-shaped contact hole is formed by photolithography and then etching.

20. The method for manufacturing the trench gate power MOSFET structure according to claim 13, wherein the gate dielectric is a dielectric with a high dielectric constant formed by deposition.

21. The method for manufacturing the trench gate power MOSFET structure according to claim 13, wherein the trench-shaped contact hole is formed by photolithography and then etching.

22. The method for manufacturing the trench gate power MOSFET structure according to claim 21, wherein the etching is dry etching, including, but not limited to, deep reactive ion etching.

23. The method for manufacturing the trench gate power MOSFET structure according to claim 13, wherein the source electrode is formed by deposition, including, but not limited to, sputtering, evaporation and electroplating.

24. The method for manufacturing the trench gate power MOSFET structure according to claim 13, wherein the gate electrode is formed by depositing polysilicon and then etching.

25. A method for manufacturing an IGBT structure, comprising:
starting with a light doping substrate wafer of a first conductivity type;
forming a body region of a second conductivity type on a top of the substrate;
forming a heavily doped polysilicon emitter region of the first conductivity type on a top of the body region;
forming a gate trench by patterning the polysilicon emitter region and the body region;
forming a gate dielectric in the gate trench and on an upper surface of the polysilicon emitter region;
forming a gate electrode by depositing and etching thereafter;
depositing an ILD on a top of the gate electrode and on the surface of the emitter region;
forming a trench-shaped contact hole by patterning the ILD and the emitter region;
forming a heavily doped diffusion of the second conductivity type at a bottom of the contact hole through ion implantation and annealing;
forming an emitter electrode on a front of the wafer;
thinning down the substrate wafer on a back of the wafer;
forming a buffer region of the first conductivity type and a heavily doped collector region of the second conductivity type on the back of the wafer; and
forming a collector electrode on the back of the wafer.

26. The method for manufacturing the IGBT structure according to claim 25, wherein the body region is formed by single or multiple times of ion implantation and annealing thereafter.

27. The method for manufacturing the IGBT structure according to claim 25, wherein the body region is formed by epitaxial growth.

28. The method for manufacturing the IGBT structure according to claim 25, wherein the polysilicon emitter region is formed by chemical vapor deposition.

29. The method for manufacturing the IGBT structure according to claim 25, wherein the polysilicon emitter region is formed by converting amorphous silicon into polysilicon through depositing the amorphous silicon and annealing thereafter.

30. The method for manufacturing the IGBT structure according to claim 25, wherein the polysilicon emitter region is formed by depositing amorphous silicon and converting the amorphous silicon into polysilicon in the process of forming the gate dielectric.

31. The method for manufacturing the IGBT structure according to claim 25, wherein the trench-shaped contact hole is formed by photolithography and then etching.

32. The method for manufacturing the IGBT structure according to claim 25, wherein the gate dielectric is a dielectric with a high dielectric constant formed by deposition.

33. The method for manufacturing the IGBT structure according to claim 25, wherein the trench-shaped contact hole is formed by photolithography and then etching.

34. The method for manufacturing the IGBT structure according to claim 33, wherein the etching is dry etching, including, but not limited to, deep reactive ion etching.

35. The method for manufacturing the IGBT structure according to claim 25, wherein the emitter electrode is formed by deposition, including, but not limited to, sputtering, evaporation and electroplating.

36. The method for manufacturing the IGBT structure according to claim 25, wherein the gate electrode is formed by depositing the polysilicon and then etching.

37. A method for manufacturing an IGBT structure, comprising:
starting with a lightly doped substrate wafer of a first conductivity type,
forming a body region of a second conductivity type on a top of the substrate;
forming a heavily doped polysilicon emitter region of the first conductivity type on a top of the body region,
forming a gate trench by patterning the polysilicon emitter region and the body region,
forming a gate dielectric in the gate trench and on an upper surface of the polysilicon emitter region,
forming a gate electrode by deposition and then etching,
depositing an ILD on a top of the gate electrode and on the surface of the emitter region,
thinning down the substrate wafer on a back of the wafer,
forming a buffer region of the first conductivity type and a heavily doped collector region of the second conductivity type on the back of the wafer,
forming a trench-shaped contact hole by patterning the ILD and the emitter region,
forming a heavily doped diffusion region of the second conductivity type at a bottom of the contact hole through ion implantation and annealing, and
forming an emitter electrode on a front of the wafer and a collector electrode on the back of the wafer.

38. The method for manufacturing the IGBT structure according to claim 37, wherein the body region is formed by single or multiple times of ion implantation and then annealing.

39. The method for manufacturing the IGBT structure according to claim 37, wherein the body region is formed by epitaxial growth.

40. The method for manufacturing the IGBT structure according to claim 37, wherein the polysilicon emitter region is formed by chemical vapor deposition.

41. The method for manufacturing the IGBT structure according to claim 37, wherein the polysilicon emitter region is formed by depositing and then annealing amorphous silicon to convert the amorphous silicon into polysilicon.

42. The method for manufacturing the IGBT structure according to claim 37, wherein the polysilicon emitter region is formed by depositing amorphous silicon and converting the amorphous silicon into polysilicon in the process of forming the gate dielectric.

43. The method for manufacturing the IGBT structure according to claim 37, wherein the gate dielectric is silicon oxide formed by oxidation or deposition.

44. The method for manufacturing the IGBT structure according to claim 37, wherein the gate dielectric is a dielectric with a high dielectric constant formed by deposition.

45. The method for manufacturing the IGBT structure according to claim 37, wherein the trench-shaped contact hole is formed by photolithography and then etching.

46. The method for manufacturing the IGBT structure according to claim 45, wherein the etching is dry etching, including, but not limited to, deep reactive ion etching.

47. The method for manufacturing the IGBT structure according to claim 37, wherein the emitter electrode is formed by deposition, including, but not limited to, sputtering, evaporation and electroplating.

48. The method for manufacturing the IGBT structure according to claim 37, wherein the gate electrode is formed by depositing the polysilicon and then etching.

* * * * *